United States Patent
Udrea et al.

(10) Patent No.: US 9,768,284 B2
(45) Date of Patent: Sep. 19, 2017

(54) BIPOLAR SEMICONDUCTOR DEVICE HAVING A CHARGE-BALANCED INTER-TRENCH STRUCTURE

(71) Applicant: Infineon Technologies Americas Corp., El Segundo, CA (US)

(72) Inventors: Florin Udrea, Cambridge (GB); Alice Pei-Shan Hsieh, Cambridge (GB); Gianluca Camuso, Cambridge (GB); Chiu Ng, El Segundo, CA (US); Yi Tang, Torrance, CA (US); Rajeev Krishna Vytla, Los Angeles, CA (US)

(73) Assignee: Infineon Technologies Americas Corp., El Segundo, CA (US)

( * ) Notice: Subject to any disclaimer, the term of this patent is extended or adjusted under 35 U.S.C. 154(b) by 0 days.

(21) Appl. No.: 14/986,150

(22) Filed: Dec. 31, 2015

(65) Prior Publication Data
US 2016/0260824 A1   Sep. 8, 2016

Related U.S. Application Data

(60) Provisional application No. 62/128,922, filed on Mar. 5, 2015.

(51) Int. Cl.
    *H01L 29/66*    (2006.01)
    *H01L 29/739*   (2006.01)
    *H01L 29/06*    (2006.01)

(52) U.S. Cl.
    CPC ...... *H01L 29/7397* (2013.01); *H01L 29/0634* (2013.01)

(58) Field of Classification Search
    CPC ............ H01L 29/41708; H01L 29/7394
(Continued)

(56) References Cited

U.S. PATENT DOCUMENTS 8,248,116 B2     8/2012    Soeno et al.
8,304,814 B2 *   11/2012   Bauer ................. H01L 29/7455
                                                          257/139

(Continued)

OTHER PUBLICATIONS

M. Antoniou, F. Udrea and F. Bauer, "Optimization of Super Junction Bipolar Transistor for Ultra-fast Switching Applications", Proc. ISPSD'2007, p. 101-104.

(Continued)

*Primary Examiner* — Chandra Chaudhari
(74) *Attorney, Agent, or Firm* — Murphy, Bilak & Homiller, PLLC

(57) ABSTRACT

There are disclosed herein various implementations of a bipolar semiconductor device having a charge-balanced inter-trench structure. Such a device includes a drift region having a first conductivity type situated over an anode layer having a second conductivity type. The device also includes first and second control trenches extending through an inversion region having the second conductivity type into the drift region, each of the first and second control trenches being bordered by a cathode diffusion having the first conductivity type. In addition, the device includes an inter-trench structure situated in the drift region between the first and second control trenches. The inter-trench structure includes one or more first conductivity regions having the first conductivity type and one or more second conductivity region having the second conductivity type, the one or more first conductivity regions and the one or more second conductivity regions configured to substantially charge-balance the inter-trench structure.

14 Claims, 4 Drawing Sheets

(58) Field of Classification Search
USPC .................................. 257/142; 438/138, 206
See application file for complete search history.

(56) References Cited

U.S. PATENT DOCUMENTS

| | | |
|---|---|---|
| 9,024,383 B2 | 5/2015 | Gamerith et al. |
| 9,093,522 B1 * | 7/2015 | Zeng .................... H01L 29/7813 |
| 2007/0034941 A1 * | 2/2007 | Francis ............... H01L 29/7397 |
| | | 257/328 |
| 2008/0135929 A1 | 6/2008 | Saito et al. |
| 2010/0264488 A1 | 10/2010 | Hsieh |
| 2011/0084333 A1 | 4/2011 | Disney |
| 2011/0233684 A1 | 9/2011 | Matsushita |
| 2012/0001199 A1 | 1/2012 | Bauer |
| 2014/0077289 A1 | 3/2014 | Miyajima |
| 2014/0097517 A1 | 4/2014 | Moens |
| 2015/0115286 A1 | 4/2015 | Takeuchi et al. |

OTHER PUBLICATIONS

M. Antoniou, F. Udrea, and F. D. Bauer, "The superjunction insulated gate bipolar transistor-Optimization and modeling," IEEE Trans. Electron Devices, vol. 57, No. 3, p. 594-600, Mar. 2010.

M. Antoniou, F. Udrea, F. D. Bauer, A. Mihaila, and I. Nistor "Towards Achieving the Soft-Punch-Through Superjunction Insulated-Gate Bipolar Transistor Breakdown Capability", IEEE Electron Device Letters, vol. 32, No. 9, Sep. 2011, p. 1275-1277.

F. Bauer, I. Nistor, A. Mihaila, M. Antoniou, and F. Udrea "Superjunction IGBT Filling the Gap Between SJ MOSFET and Ultrafast IGBT", IEEE Electron Device Letters, vol. 33, No. 9, Sep. 2012, p. 1288-1290.

* cited by examiner

BIPOLAR SEMICONDUCTOR DEVICE HAVING A CHARGE-BALANCED INTER-TRENCH STRUCTURE

The present application claims the benefit of and priority to a provisional application titled "Super Junction IGBT with PNN Structure for High Frequency Applications," Ser. No. 62/128,922 filed on Mar. 5, 2015. The disclosure in this provisional application is hereby incorporated fully by reference into the present application.

BACKGROUND

Background Art

Bipolar semiconductor devices suitable for use as power switches, such as insulated-gate bipolar transistors (IGBTs), for example, may be implemented in a variety of applications. For instance, IGBTs may be used as power switches in motor drive inverters, as well as in direct-current (DC) to DC power converters. In these and other power applications, turn-off losses ($E_{OFF}$) and on-state voltage drop ($V_{ON}$) are typically key operating parameters, so that IGBTs having low $V_{ON}$ and substantially minimized $E_{OFF}$ during fast switching are highly desirable.

However, as switching speed increases, switching losses, including $E_{OFF}$, typically represent a significant portion of total power loss by a bipolar power switch. Moreover, conventional techniques for minimizing $E_{OFF}$ during fast switching can have undesirable consequences for the on-state characteristics of the bipolar power switch, such as $V_{ON}$.

SUMMARY

The present disclosure is directed to a bipolar semiconductor device having a charge-balanced inter-trench structure, substantially as shown in and/or described in connection with at least one of the figures, and as set forth in the claims.

DETAILED DESCRIPTION

Figure 1:
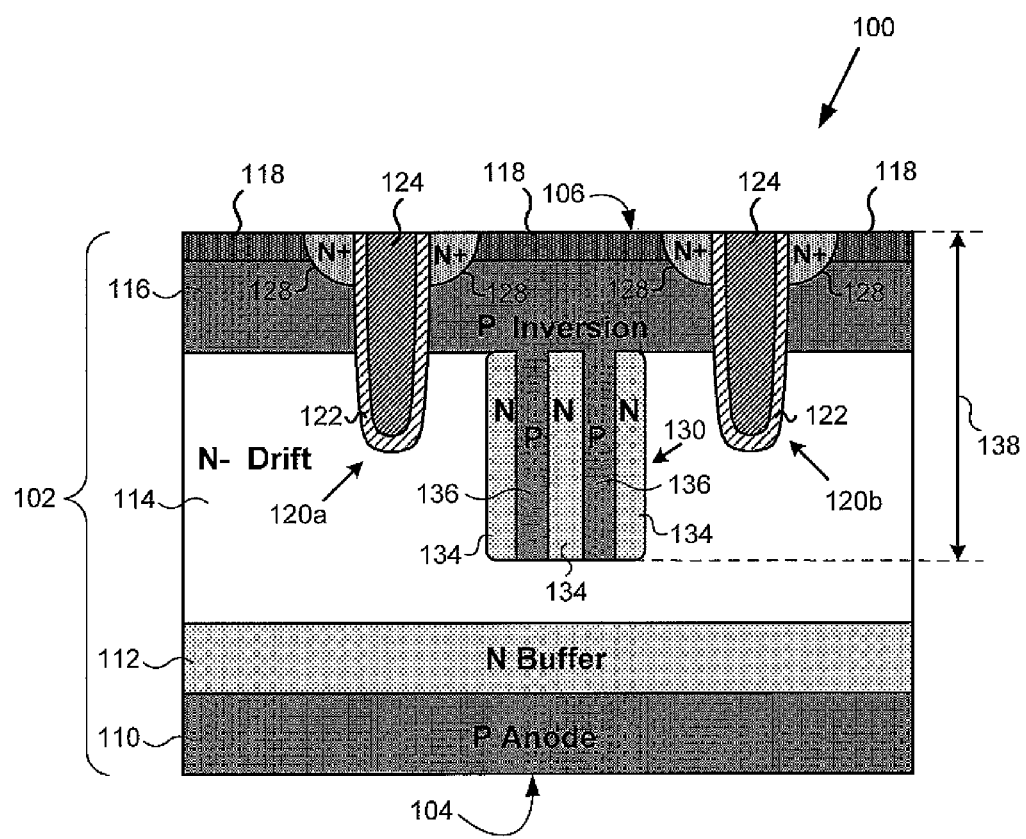
FIG. 1 presents a cross-sectional view showing a portion of an exemplary bipolar semiconductor device having a charge-balanced inter-trench structure, according to one implementation.

The following description contains specific information pertaining to implementations in the present disclosure. One skilled in the art will recognize that the present disclosure may be implemented in a manner different from that specifically discussed herein. The drawings in the present application and their accompanying detailed description are directed to merely exemplary implementations. Unless noted otherwise, like or corresponding elements among the figures may be indicated by like or corresponding reference numerals. Moreover, the drawings and illustrations in the present application are generally not to scale, and are not intended to correspond to actual relative dimensions.

FIG. 1 presents a cross-sectional view showing a portion of exemplary bipolar semiconductor device 100 having a charge-balanced inter-trench structure, according to one implementation. As shown in FIG. 1, bipolar semiconductor device 100 is implemented as a vertical power device including P type anode layer 110 at bottom surface 104 of semiconductor substrate 102, and N type drift region 114 situated over P type anode layer 110. In addition, P type inversion region 116 is situated over N type drift region 114. As further shown in FIG. 1, bipolar semiconductor device 100 includes N type buffer or field stop layer 112 (hereinafter "buffer layer 112"), as well as N type cathode diffusions 128 and P type contacts 118 formed in P type inversion region 116.

Bipolar semiconductor device 100 also includes first control trench 120a and second control trench 120b, each extending from top surface 106 of semiconductor substrate 102, through P type inversion region 116, and into N type drift region 114. As further shown in FIG. 1, each of first control trench 120a and second control trench 120b is bordered by N type cathode diffusions 128, and includes control trench insulator 122 and control trench electrode 124. In addition, bipolar semiconductor device 100 includes inter-trench structure 130, situated in N type drift region 114 between first control trench 120a and second control trench 120b, and extending to a depth 138 below top surface 106 of semiconductor substrate 102. As shown in FIG. 1, inter-trench structure 130 includes one or more N type regions 134 and one or more P type regions 136. One or more N type regions 134 and one or more P type regions 136 are configured to substantially charge-balance inter-trench structure 130.

It is noted that, in operation, bipolar semiconductor device 100 is configured to produce conduction channels through P type inversion region 116 in regions beneath N type cathode diffusions 128 and immediately adjacent first control trench 120a and second control trench 120b. Thus, when bipolar semiconductor device 100 is turned on, conduction channels (not shown as such in FIG. 1) are produced as N type conduction channels through P type inversion region 116 so as to enable transfer of charge carriers between N type cathode diffusions 128 and P type anode layer 110.

It is further noted that although the implementation shown in FIG. 1 depicts bipolar semiconductor device 100 as having P type anode layer 110, N type buffer layer 112, N type drift region 114, P type inversion region 116, N type cathode diffusions 128, and as being configured to produce N type conduction channels, that representation is merely exemplary. In other implementations, the described polarities can be reversed. That is to say, bipolar semiconductor device 100 may have an N type layer corresponding to P type anode layer 110, a P type buffer layer, a P type drift region, an N type inversion region, P type diffusions corresponding to N type cathode diffusions 128, and may be configured to produce P type conduction channels adjacent first control trench 120a and second control trench 120b.

According to one exemplary implementation, bipolar semiconductor device 100 may take the form of an insulated-gate bipolar transistor (IGBT). In that implementation, P type anode layer 110 corresponds to a P type collector layer, P type inversion region 116 corresponds to a P type base, and N type cathode diffusions 128 correspond to N type emitter diffusions of the IGBT. Moreover, when bipolar semiconductor device 100 is implemented as an IGBT, first control trench 120a and second control trench 120b correspond respectively to gate trenches of the IGBT, each including a gate dielectric and a gate electrode corresponding respectively to control trench dielectric 122 and control trench electrode 124.

Semiconductor substrate 102 may be a silicon (Si) substrate or a silicon carbide (SiC) substrate, for example. In some implementations, semiconductor substrate 102 may include N type drift region 114 and P type inversion region 116 formed in an epitaxial silicon layer of semiconductor substrate 102. Formation of such an epitaxial silicon layer may be performed by any suitable method, as known in the art, such as chemical vapor deposition (CVD) or molecular beam epitaxy (MBE), for example. More generally, however, N type drift region 114 and P type inversion region 116 may be formed in any suitable elemental or compound semiconductor layer included in semiconductor substrate 102.

Thus, in other implementations, N type drift region 114 and P type inversion region 116 need not be formed through epitaxial growth, and/or need not be formed of silicon. For example, in one alternative implementation, N type drift region 114 and P type inversion region 116 can be formed in a float zone silicon layer of semiconductor substrate 102. In other implementations, N type drift region 114 and P type inversion region 116 can be formed in either a strained or unstrained germanium layer formed as part of semiconductor substrate 102. Moreover, in some implementations, semiconductor substrate 102 may include additional layers, such as N type buffer layer 112 situated between P type anode layer 110 and N type drift region 114, as shown in FIG. 1.

P type inversion region 116 may be formed by implantation and thermal diffusion. For example, boron (B) dopants may be implanted into semiconductor substrate 102 and diffused to form P type inversion region 116. Moreover, P type contacts 118 of P type inversion region 116 may be more highly doped regions of P type inversion region 116 utilizing the same dopant species used to form P type inversion region 116.

Control trench insulator 122 may be formed using any material and any technique typically employed in the art. For example, control trench insulator 122 may be formed of silicon oxide, and may be deposited or thermally grown to line first control trench 120a and second control trench 120b. Control trench electrodes 124 may also be formed using any material typically utilized in the art. For example, control trench electrodes 124 may be formed of doped polysilicon or metal. Although not explicitly shown in FIG. 1, control trench electrodes 124 can be electrically connected to one another in the third dimension relative to the cross-sectional perspective shown by FIG. 1.

As shown in FIG. 1, each of first control trench 120a and second control trench 120b is bordered by N type cathode diffusions 128. N type cathode diffusions 128 may be selectively formed in P type inversion region 116 using any conventional techniques known in the art. For example, phosphorus (P) or arsenic (As) dopants may be implanted into P type inversion region 116 and diffused to form N type cathode diffusions 128. As is the case for control trench electrodes 124, and although also not explicitly shown in FIG. 1, N type cathode diffusions 128 can be electrically connected to one another in the third dimension relative to the cross-sectional perspective shown by FIG. 1.

As noted above, inter-trench structure 130 includes at least one N type region 134 and at least one P type region 136. Moreover, and as shown in FIG. 1, in some implementations, inter-trench structure 130 may include multiple N type regions 134 and multiple P type regions 136. However, in no implementation does inter-trench structure 130 include more P type regions 136 than N type regions 134. In other words, while the number of N type regions 134 may equal or exceed the number of P type regions 136, the number of N type regions 134 is never less than the number of P type regions 136.

In one implementation, for example, inter-trench structure 130 may include one N type region 134 adjoined by one P type region 136. In another exemplary implementation, inter-trench structure 130 may include two N type regions 134 and one P type region 136 situated between and adjoining the two N type regions 134. In yet another exemplary implementation, inter-trench structure 130 may include multiple N type regions 134 and multiple P type regions 136, where each P type region 136 is situated between two N type regions 134.

N type regions 134 and P type regions 136 of inter-trench structure 130 may have a doping concentration greater than that of N type drift region 114 and less than that of N type cathode diffusions 128. In one implementation, N type regions 134 and P type regions 136 may have a doping concentration substantially equal to that of N type buffer layer 112. For example, N type regions 134 and P type regions 136 may have a doping concentration of from approximately $1\times10^{15}/cm^3$ to approximately $1\times10^{16}/cm^3$, while the doping concentration of N type drift region 114 is typically from approximately $1\times10^{13}/cm^3$ to approximately $2\times10^{14}/cm^3$.

It is noted that inter-trench structure 130 is not situated under first control trench 120a or under second control trench 120b. That is to say, inter-trench structure 130 is situated between first control trench 120a and second control trench 120b, but does not extend under either of first control trench 120a or second control trench 120b. Moreover, according to the exemplary implementation shown in FIG. 1, inter-trench structure 130 adjoins P type inversion region 116 and terminates in N type drift region 114 at depth 138, which is above N type buffer layer 112. In other words, in some implementations, inter-trench structure 130 adjoins P type inversion region 116 while being spaced apart from N type buffer layer 112 by N type drift region 114.

As noted above, N type region or regions 134 and P type region or regions 136 are configured to substantially charge-balance inter-trench structure 130. That substantial charge-balance of inter-trench structure 130 is achieved when the surface doping density of N type region(s) 134, which equals the doping density of N type region(s) 134 multiplied by the area of N type region(s) 134 (i.e., width×depth) is substantially equal to the surface doping density of P type region(s) 136, which is analogously calculated. During turn-off of bipolar semiconductor device 100, the depletion region extends rapidly from the top of N type drift region 114 to N type buffer layer 112 due to the two-dimensional fast depletion of N type region(s) 134 and P type region(s) 136, which also enables fast extraction of deep charge carriers.

As a result, the delay time and turn-off time of bipolar semiconductor device 100 can be reduced, while the voltage blocking in the off-state is facilitated by the presence of inter-trench structure 130. During turn-off, charge-balanced inter-trench structure 130 assists in the removal of charge carriers from N type drift region 114, which is conductivity modulated, thereby significantly enhancing the switching speed and turn-off performance of bipolar semiconductor device 100. In other words, charge-balanced inter-trench structure 130 enables bipolar semiconductor device 100 to have lower turn-off losses ($E_{OFF}$), shorter delay time ($T_d$), and shorter turn-off time ($T_f$), when compared to conventional bipolar semiconductor devices, such as conventional IGBTs. Moreover, the above advantages may be achieved while maintaining the on-state voltage drop ($V_{ON}$) of bipolar semiconductor device 100 at a desirably low level.

Figure 2:
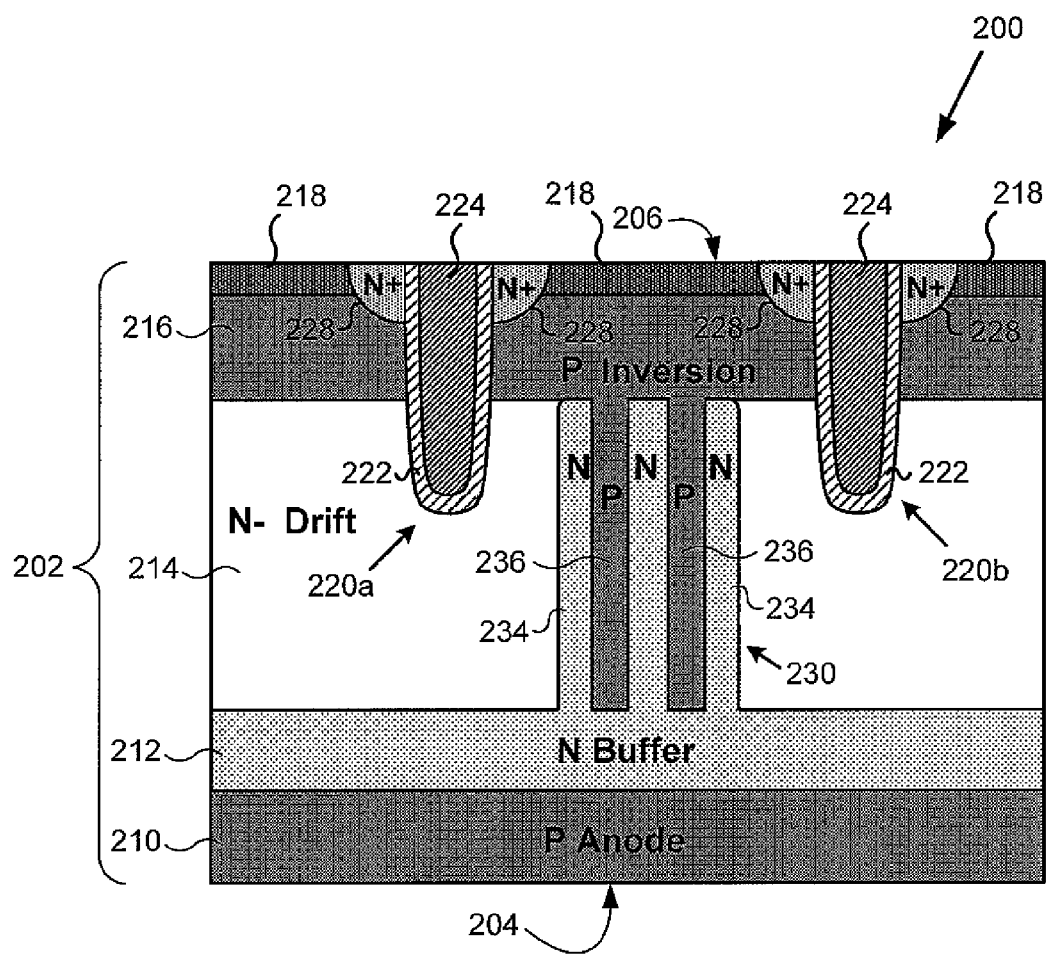
FIG. 2 presents a cross-sectional view showing a portion of an exemplary bipolar semiconductor device having a charge-balanced inter-trench structure, according to another implementation.

Continuing to FIG. 2, FIG. 2 presents a cross-sectional view showing a portion of exemplary bipolar semiconductor device 200 having a charge-balanced inter-trench structure, according to another implementation. As shown in FIG. 2, bipolar semiconductor device 200 is implemented as a vertical power device including P type anode layer 210 at bottom surface 204 of semiconductor substrate 202, and N type drift region 214 situated over P type anode layer 210. In addition, P type inversion region 216 is situated over N type drift region 214. As further shown in FIG. 2, bipolar semiconductor device 200 includes N type buffer layer 212, as well as N type cathode diffusions 228 and P type contacts 218 formed in P type inversion region 216.

Bipolar semiconductor device 200 also includes first control trench 220a and second control trench 220b, each extending from top surface 206 of semiconductor substrate 202, through P type inversion region 216, and into N type drift region 214. As further shown in FIG. 2, each of first control trench 220a and second control trench 220b is bordered by N type cathode diffusions 228, and includes control trench insulator 222 and control trench electrode 224. In addition, bipolar semiconductor device 200 includes inter-trench structure 230 situated in N type drift region 214 between first control trench 220a and second control trench 220b. As shown in FIG. 1, inter-trench structure 230 includes one or more N type regions 234 and one or more P type regions 236. One or more N type regions 234 and one or more P type regions 236 are configured to substantially charge-balance inter-trench structure 230.

Bipolar semiconductor device 200 corresponds in general to bipolar semiconductor device 100, in FIG. 1. That is to say, semiconductor substrate 202, P type anode layer 210, N type buffer layer 212, and N type drift region 214, in FIG. 2, correspond respectively in general to semiconductor substrate 102, P type anode layer 110, N type buffer layer 112, and N type drift region 114, in FIG. 1, and may share any of the characteristics attributed to those corresponding features, above.

In addition, P type inversion region 216, P type contacts 218, and N type cathode diffusions 228, in FIG. 2, correspond respectively in general to P type inversion region 116, P type contacts 118, and N type cathode diffusions 128, in FIG. 1 and may share any of the characteristics attributed to those corresponding features, above. Moreover, first control trench 220a and second control trench 220b each including control trench insulator 222 and control trench electrode 224, in FIG. 2, correspond respectively in general to first control trench 120a and second control trench 120b each including control trench insulator 122 and control trench electrode 124, in FIG. 1, and may share any of the characteristics attributed to those corresponding features, above. Furthermore, it is noted that, like bipolar semiconductor device 100, in FIG. 1, bipolar semiconductor device 200, in FIG. 2, may take the form of an IGBT.

As shown in FIG. 2, inter-trench structure 230 includes at least one N type region 234 and at least one P type region 236. Moreover, and as shown in FIG. 1, in some implementations, inter-trench structure 230 may include multiple N type regions 234 and multiple P type regions 236. However, in no implementation does inter-trench structure 230 include more P type regions 236 than N type regions 234. In other words, while the number of N type regions 234 may equal or exceed the number of P type regions 236, the number of N type regions 234 is never less than the number of P type regions 236.

In one implementation, for example, inter-trench structure 230 may include one N type region 234 adjoined by one P type region 236. In another exemplary implementation, inter-trench structure 230 may include two N type regions 234 and one P type region 236 situated between and adjoining the two N type regions 234. In yet another exemplary implementation, inter-trench structure 230 may include multiple N type regions 234 and multiple P type regions 236, where each P type region 236 is situated between two N type regions 234.

N type regions 234 and P type regions 236 correspond in general to N type regions 134 and P type region 136, in FIG. 1, and may share any of the characteristics attributed to those corresponding features, above. It is noted that inter-trench structure 230 is not situated under first control trench 220a or under second control trench 220b. That is to say, inter-trench structure 230 is situated between first control trench 220a and second control trench 220b, but does not extend under either of first control trench 220a or second control trench 220b.

Moreover, according to the exemplary implementation shown in FIG. 2, inter-trench structure 230 extends through N type drift region 214 to adjoin N type buffer layer 212. In other words, in some implementations, inter-trench structure 230 adjoins P type inversion region 216 while concurrently adjoining N type buffer layer 212. As a result, in implementations in which inter-trench structure 230 adjoins both P type inversion region 216 and N type buffer layer 212, and includes more N type regions 234 than P type regions 236, N type regions 234 are adjoined by N type drift region 214. Thus, in some implementations in which inter-trench structure 230 adjoins both P type inversion region 216 and N type buffer layer 212, and includes more N type regions 234 than P type regions 236, no portion of inter-trench structure 230 forms a PN junction with N type drift region 214.

As noted above, N type region or regions 234 and P type region or regions 236 are configured to substantially charge-balance inter-trench structure 230. During turn-off of bipolar semiconductor device 200, the depletion region extends rapidly from the top of N type drift region 214 to N type buffer layer 212 due to the two-dimensional fast depletion of N type region(s) 234 and P type region(s) 236, which also enables fast extraction of deep charge carriers.

As a result, the delay time and turn-off time of bipolar semiconductor device 200 can be reduced, while voltage blocking in the off-state is facilitated by the presence of inter-trench structure 230. During turn-off, charge-balanced inter-trench structure 230 assists in removal of charge carriers from N type drift region 214, which is conductivity modulated, thereby significantly enhancing the switching speed and turn-off performance of bipolar semiconductor device 200. In other words, charge-balanced inter-trench structure 230 enables bipolar semiconductor device 200 to have lower $E_{OFF}$, shorter $T_d$, and shorter $T_f$, when compared to conventional bipolar semiconductor devices, such as conventional IGBTs. Moreover, the above advantages may be achieved while maintaining $V_{ON}$ of bipolar semiconductor device 200 at a desirably low level.

Figure 3:
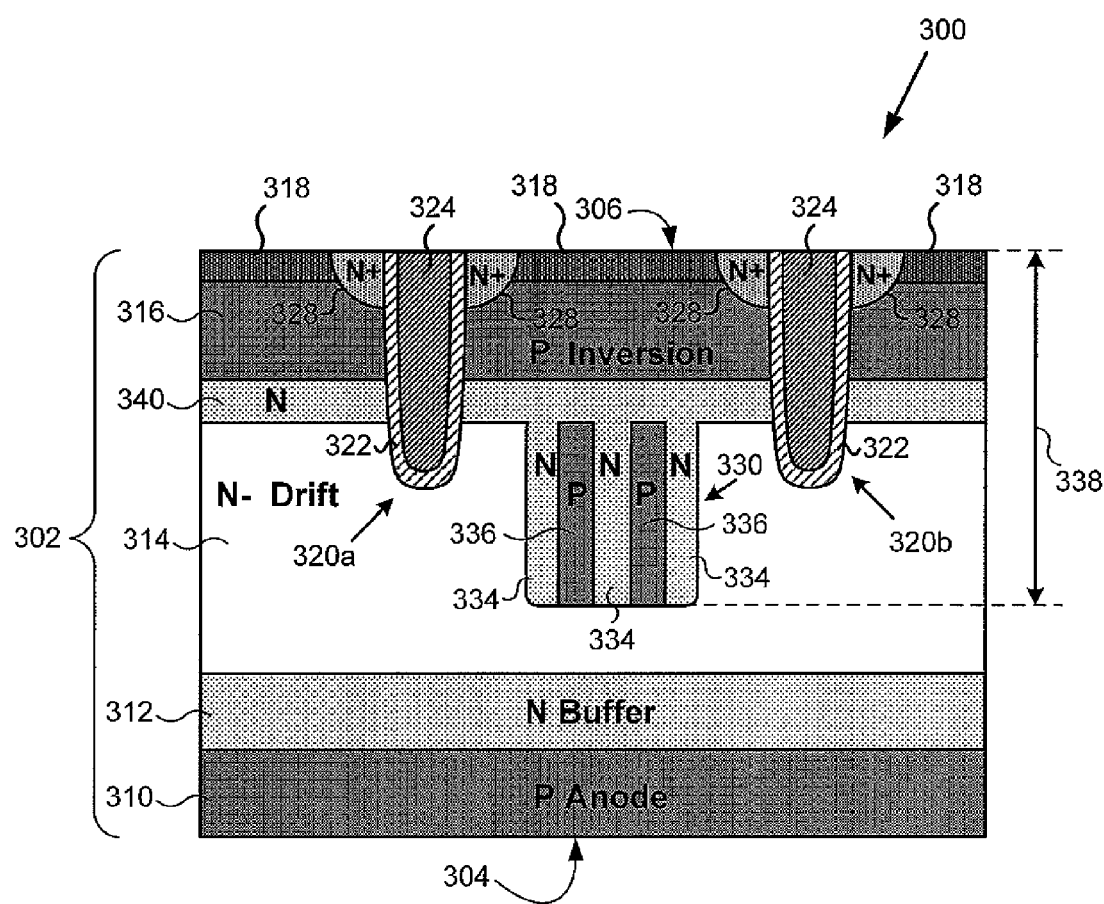
FIG. 3 presents a cross-sectional view showing a portion of an exemplary bipolar semiconductor device having a charge-balanced inter-trench structure, according to yet another implementation.

Moving to FIG. 3, FIG. 3 presents a cross-sectional view showing a portion of exemplary bipolar semiconductor device 300 having a charge-balanced inter-trench structure, according to yet another implementation. As shown in FIG. 3, bipolar semiconductor device 300 is implemented as a vertical power device including P type anode layer 310 at bottom surface 304 of semiconductor substrate 302, and N type drift region 314 situated over P type anode layer 310. In addition, P type inversion region 316 is situated over N type drift region 314. As further shown in FIG. 3, bipolar semiconductor device 300 includes N type buffer layer 312, as well as N type cathode diffusions 328 and P type contacts 318 formed in P type inversion region 316. Moreover, bipolar semiconductor device 300 further includes N type enhancement layer 340 situated between N type drift region 314 and P type inversion region 316.

Bipolar semiconductor device 300 also includes first control trench 320a and second control trench 320b, each extending from top surface 306 of semiconductor substrate 302, through P type inversion region 316, through N type enhancement layer 340, and into N type drift region 314. As further shown in FIG. 3, each of first control trench 320a and second control trench 320b is bordered by N type cathode diffusions 328, and includes control trench insulator 322 and control trench electrode 324. In addition, bipolar semiconductor device 300 includes inter-trench structure 330, situated in N type drift region 314 between first control trench 320a and second control trench 320b, and extending to a depth 338 below top surface 306 of semiconductor substrate 302. As shown in FIG. 1, inter-trench structure 330 includes one or more N type regions 334 and one or more P type regions 336. One or more N type regions 334 and one or more P type regions 336 are configured to substantially charge-balance inter-trench structure 330.

Bipolar semiconductor device 300 corresponds in general to bipolar semiconductor device 100, in FIG. 1. That is to say, semiconductor substrate 302, P type anode layer 310, N type buffer layer 312, and N type drift region 314, in FIG. 3, correspond respectively in general to semiconductor substrate 102, P type anode layer 110, N type buffer layer 112, and N type drift region 114, in FIG. 1, and may share any of the characteristics attributed to those corresponding features, above.

In addition, P type inversion region 316, P type contacts 318, and N type cathode diffusions 328, in FIG. 3, correspond respectively in general to P type inversion region 116, P type contacts 118, and N type cathode diffusions 128, in FIG. 1 and may share any of the characteristics attributed to those corresponding features, above. Moreover, first control trench 320a and second control trench 320b each including control trench insulator 322 and control trench electrode 324, in FIG. 3, correspond respectively in general to first control trench 120a and second control trench 120b each including control trench insulator 122 and control trench electrode 124, in FIG. 1, and may share any of the characteristics attributed to those corresponding features, above. Furthermore, it is noted that, like bipolar semiconductor device 100, in FIG. 1, bipolar semiconductor device 300, in FIG. 3, may take the form of an IGBT.

As shown in FIG. 3, N type enhancement layer 340 is situated between N type drift region 314 and P type inversion region 316. For example, phosphorus or arsenic dopants may be implanted into N type drift region 314 to produce N type enhancement layer 340 having a doping concentration of from approximately $1 \times 10^{15}/cm^3$ to approximately $1 \times 10^{16}/cm^3$.

According to the implementation shown in FIG. 3, inter-trench structure 330 includes at least one N type region 334 and at least one P type region 336. Moreover, and as shown in FIG. 1, in some implementations, inter-trench structure 330 may include multiple N type regions 334 and multiple P type regions 336. However, in no implementation does inter-trench structure 330 include more P type regions 336 than N type regions 334. In other words, while the number of N type regions 334 may equal or exceed the number of P type regions 336, the number of N type regions 334 is never less than the number of P type regions 336.

In one implementation, for example, inter-trench structure 330 may include one N type region 334 adjoined by one P type region 336. In another exemplary implementation, inter-trench structure 330 may include two N type regions 334 and one P type region 336 situated between and adjoining the two N type regions 334. In yet another exemplary implementation, inter-trench structure 330 may include multiple N type regions 334 and multiple P type regions 336, where each P type region 336 is situated between two N type regions 334.

N type regions 334, P type regions 336, and depth 338 of inter-trench structure 330 correspond in general to N type regions 134, P type regions 136, and depth 138 of inter-trench structure 130, in FIG. 1, and may share any of the characteristics attributed to those corresponding features, above. It is noted that inter-trench structure 330 is not situated under first control trench 320a or under second control trench 320b. That is to say, inter-trench structure 330 is situated between first control trench 320a and second control trench 320b, but does not extend under either of first control trench 320a or second control trench 320b. Moreover, according to the exemplary implementation shown in FIG. 3, inter-trench structure 330 adjoins N type enhancement layer 340 and terminates in N type drift region 314 at depth 338, which is above N type buffer layer 312. In other words, in some implementations, inter-trench structure 330 adjoins N type enhancement layer 340 while being spaced apart from N type buffer layer 312 by N type drift region 314.

As noted above, N type region or regions 334 and P type region or regions 336 are configured to substantially charge-balance inter-trench structure 330. During turn-off of bipolar semiconductor device 300, the depletion region extends rapidly from the top of N type drift region 314 to N type buffer layer 312 due to the two-dimensional fast depletion of N type region(s) 334 and P type region(s) 336, which also enables fast extraction of deep charge carriers.

As a result, the delay time and turn-off time of bipolar semiconductor device 300 can be reduced, while voltage blocking in the off-state is facilitated by the presence of inter-trench structure 330. During turn-off, charge-balanced inter-trench structure 330 assists in removal of charge carriers from N type drift region 314, which is conductivity modulated, thereby significantly enhancing the switching speed and turn-off performance of bipolar semiconductor device 300. In other words, charge-balanced inter-trench structure 330 enables bipolar semiconductor device 300 to have lower $E_{OFF}$, shorter $T_d$, and shorter $T_f$, when compared to conventional bipolar semiconductor devices, such as conventional IGBTs. Moreover, the above advantages may be achieved while maintaining $V_{ON}$ of bipolar semiconductor device 300 at a desirably low level.

Figure 4:
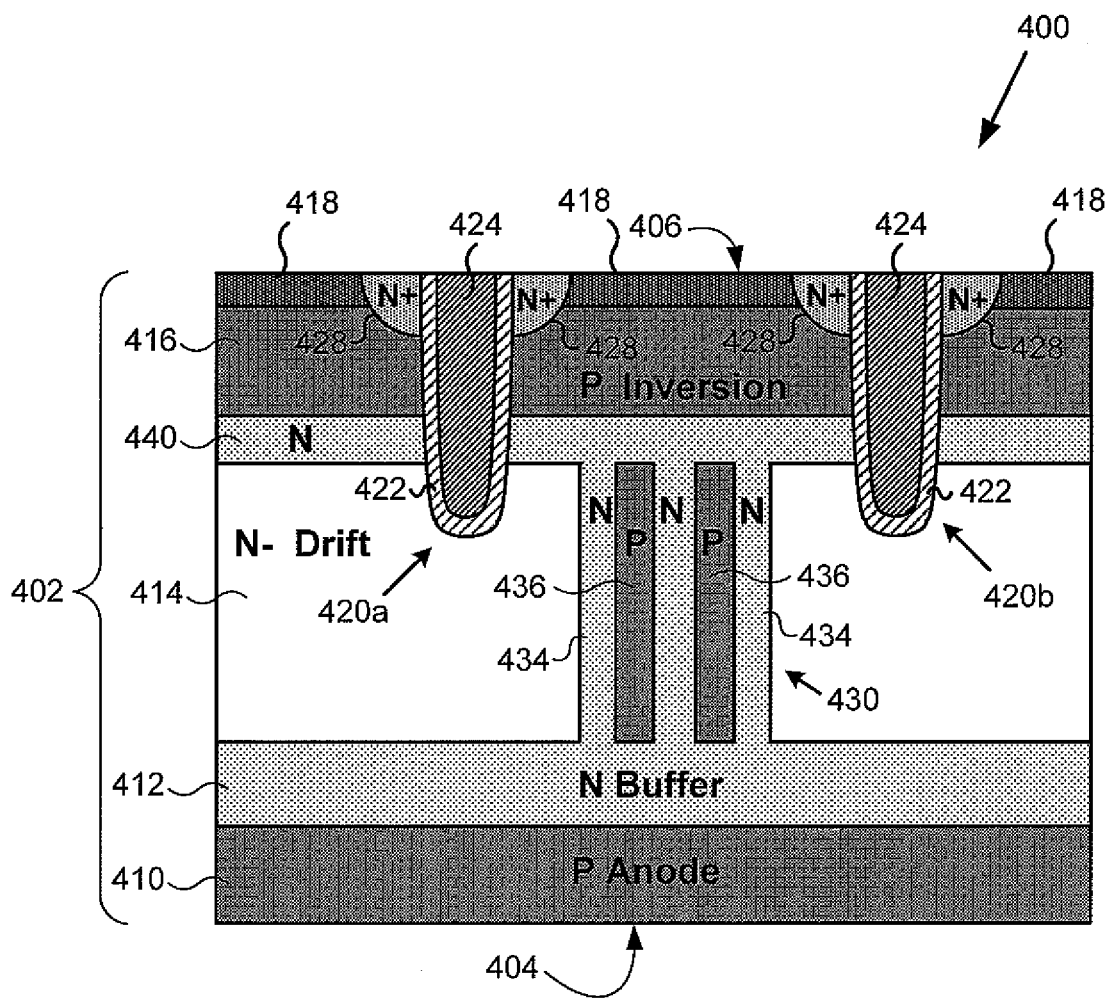
FIG. 4 presents a cross-sectional view showing a portion of an exemplary bipolar semiconductor device having a charge-balanced inter-trench structure, according to a further implementation.

Referring now to FIG. 4, FIG. 4 presents a cross-sectional view showing a portion of exemplary bipolar semiconductor device 400 having a charge-balanced inter-trench structure, according to a further implementation. As shown in FIG. 4, bipolar semiconductor device 400 is implemented as a vertical power device including P type anode layer 410 at bottom surface 404 of semiconductor substrate 402, and N type drift region 414 situated over P type anode layer 410. In addition, P type inversion region 416 is situated over N type drift region 414. As further shown in FIG. 4, bipolar semiconductor device 400 includes N type buffer layer 412, as well as N type cathode diffusions 428 and P type contacts 418 formed in P type inversion region 416. Moreover, bipolar semiconductor device 400 further includes N type enhancement layer 440 situated between N type drift region 414 and P type inversion region 416.

Bipolar semiconductor device 400 also includes first control trench 420a and second control trench 420b, each extending from top surface 406 of semiconductor substrate 402, through P type inversion region 416, through N type enhancement layer 440, and into N type drift region 414. As further shown in FIG. 4, each of first control trench 420a and second control trench 420b is bordered by N type cathode diffusions 428, and includes control trench insulator 422 and control trench electrode 424. In addition, bipolar semiconductor device 400 includes inter-trench structure 430, situated in N type drift region 414 between first control trench 420a and second control trench 420b. As shown in FIG. 4, inter-trench structure 430 includes one or more N type regions 434 and one or more P type regions 436. One or more N type regions 434 and one or more P type regions 436 are configured to substantially charge-balance inter-trench structure 430.

Bipolar semiconductor device 400 corresponds in general to bipolar semiconductor device 100, in FIG. 1. That is to say, semiconductor substrate 402, P type anode layer 410, N type buffer layer 412, and N type drift region 414, in FIG. 4, correspond respectively in general to semiconductor substrate 102, P type anode layer 110, N type buffer layer 112, and N type drift region 114, in FIG. 1, and may share any of the characteristics attributed to those corresponding features, above.

In addition, P type inversion region 416, P type contacts 418, and N type cathode diffusions 428, in FIG. 4, correspond respectively in general to P type inversion region 116, P type contacts 118, and N type cathode diffusions 128, in FIG. 1 and may share any of the characteristics attributed to those corresponding features, above. Moreover, first control trench 420a and second control trench 420b each including control trench insulator 422 and control trench electrode 424, in FIG. 4, correspond respectively in general to first control trench 120a and second control trench 120b each including control trench insulator 122 and control trench electrode 124, in FIG. 1, and may share any of the characteristics attributed to those corresponding features, above.

Furthermore, N type enhancement layer 440, in FIG. 4, corresponds in general to N type enhancement layer 340, in FIG. 3, and may share any of the characteristics attributed to that corresponding feature, above. Thus, like bipolar semiconductor devices 100 and 300, in respective FIG. 1 and FIG. 3, bipolar semiconductor device 400, in FIG. 4, may take the form of an IGBT.

According to the implementation shown in FIG. 4, inter-trench structure 430 includes at least one N type region 434 and at least one P type region 436. Moreover, and as shown in FIG. 1, in some implementations, inter-trench structure 430 may include multiple N type regions 434 and multiple P type regions 436. However, in no implementation does inter-trench structure 430 include more P type regions 436 than N type regions 434. In other words, while the number of N type regions 434 may equal or exceed the number of P type regions 436, the number of N type regions 434 is never less than the number of P type regions 436.

In one implementation, for example, inter-trench structure 430 may include one N type region 434 adjoined by one P type region 436. In another exemplary implementation, inter-trench structure 430 may include two N type regions 434 and one P type region 436 situated between and adjoining the two N type regions 434. In yet another exemplary implementation, inter-trench structure 430 may include multiple N type regions 434 and multiple P type regions 436, where each P type region 436 is situated between two N type regions 434.

N type regions 434 and P type regions 436 correspond in general to N type regions 134 and P type region 136, in FIG. 1, and may share any of the characteristics attributed to those corresponding features, above. It is noted that inter-trench structure 430 is not situated under first control trench 420a or under second control trench 420b. That is to say, inter-trench structure 430 is situated between first control trench 420a and second control trench 420b, but does not extend under either of first control trench 420a or second control trench 420b.

Moreover, according to the exemplary implementation shown in FIG. 4, inter-trench structure 430 extends through N type drift region 414 to adjoin N type buffer layer 412. In other words, in some implementations, inter-trench structure 430 adjoins N type enhancement layer 440 while concurrently adjoining N type buffer layer 412. As a result, in implementations in which inter-trench structure 430 adjoins both N type enhancement layer 440 and N type buffer layer 412, and includes more N type regions 434 than P type regions 436, N type regions 434 are adjoined by N type drift region 414. Thus, in some implementations in which inter-trench structure 430 adjoins both N type enhancement layer 440 and N type buffer layer 412, and includes more N type regions 434 than P type regions 436, no portion of inter-trench structure 430 forms a PN junction with N type drift region 414.

N type region or regions 434 and P type region or regions 436 are configured to substantially charge-balance inter-trench structure 430, as discussed above by reference to inter-trench structure 130. As a result, during turn-off of bipolar semiconductor device 400, the depletion region extends rapidly from the top of N type drift region 414 to N type buffer layer 412 due to the two-dimensional fast depletion of N type region(s) 434 and P type region(s) 436, which also enables fast extraction of deep charge carriers.

Consequently, the delay time and turn-off time of bipolar semiconductor device 400 can be reduced, while voltage blocking in the off-state is facilitated by the presence of inter-trench structure 430. During turn-off, charge-balanced inter-trench structure 430 assists in the removal of charge carriers from N type drift region 414, which is conductivity modulated, thereby significantly enhancing the switching speed and turn-off performance of bipolar semiconductor device 400.

Thus, the present application discloses implementations of a bipolar semiconductor device having a charge-balanced inter-trench structure. As disclosed in the present application, incorporating such a charge-balanced inter-trench structure into the bipolar semiconductor device enables the bipolar semiconductor device to have lower $E_{OFF}$, shorter $T_d$, and shorter $T_f$, when compared to conventional devices, such as conventional IGBTs. Moreover, these advantages may be achieved while maintaining the $V_{ON}$ of the bipolar semiconductor device at a desirably low level.

From the above description it is manifest that various techniques can be used for implementing the concepts described in the present application without departing from the scope of those concepts. Moreover, while the concepts have been described with specific reference to certain implementations, a person of ordinary skill in the art would recognize that changes can be made in form and detail without departing from the scope of those concepts. As such, the described implementations are to be considered in all respects as illustrative and not restrictive. It should also be understood that the present application is not limited to the particular implementations described herein, but many rearrangements, modifications, and substitutions are possible without departing from the scope of the present disclosure.

The invention claimed is:

1. A bipolar semiconductor device comprising:
a drift region having a first conductivity type situated over an anode layer having a second conductivity type opposite said first conductivity type;
first and second control trenches extending through an inversion region having said second conductivity type into said drift region, each of said first and second control trenches bordered by a cathode diffusion;
an inter-trench structure situated between said first and second control trenches in said drift region and comprising:
a first conductivity region having said first conductivity type disposed at a center of said inter-trench structure,
in a first lateral direction proceeding from said center towards said first control trench, a second conductivity region having said second conductivity type situated adjacent said first conductivity region, and a further portion of said first conductivity region situated adjacent said second conductivity region between said first control trench and said second conductivity region, and
in a second lateral direction proceeding from said center towards said second control trench, a further portion of said second conductivity region situated adjacent said first conductivity region, and a second further portion of said first conductivity region situated adjacent to said further portion of said second conductivity region between said second control trench and said further portion of said second conductivity region;
said first conductivity region and said second conductivity region configured to substantially charge-balance said inter-trench structure.

2. The bipolar semiconductor device of claim 1, wherein said inter-trench structure adjoins said inversion region.

3. The bipolar semiconductor device of claim 1, wherein said drift region does not adjoin said second conductivity region.

4. The bipolar semiconductor device of claim 1, further comprising an enhancement layer having said first conductivity type situated between said drift region and said inversion region, wherein said inter-trench structure adjoins said enhancement layer.

5. The bipolar semiconductor device of claim 1, further comprising a buffer layer having said first conductivity type situated between said anode layer and said drift region, said inter-trench structure being spaced apart from said buffer layer by said drift region.

6. The bipolar semiconductor device of claim 1, further comprising a buffer layer having said first conductivity type situated between said anode layer and said drift region, said inter-trench structure adjoining said buffer layer.

7. An insulated-gate bipolar transistor (IGBT) comprising:
a drift region having a first conductivity type situated over a collector having a second conductivity type opposite said first conductivity type;
first and second gate trenches extending through a base having said second conductivity type into said drift region, each of said first and second gate trenches bordered by an emitter diffusion;
an inter-trench structure situated between said first and second gate trenches in said drift region and comprising:
a first conductivity region having said first conductivity type disposed at a center of said inter-trench structure,
in a first lateral direction proceeding from said center towards said first gate trench, a second conductivity region having said second conductivity type situated adjacent said first conductivity region, and a further portion of said first conductivity region situated adjacent said second conductivity region between said first gate trench and said second conductivity region, and
in a second lateral direction proceeding from said center towards said second gate trench, a further portion of said second conductivity region situated adjacent said first conductivity region, and a second further portion of said first conductivity region situated adjacent to said further portion of said second conductivity region between said second gate trench and said further portion of said second conductivity region;
said first conductivity region and said second conductivity region configured to substantially charge-balance said inter-trench structure.

8. The IGBT of claim 7, wherein said inter-trench structure adjoins said base.

9. The IGBT of claim 7, wherein said drift region does not adjoin said second conductivity region.

10. The IGBT of claim 7, further comprising an enhancement layer having said first conductivity type situated between said drift region and said base, wherein said inter-trench structure adjoins said enhancement layer.

11. The IGBT of claim 7, further comprising a buffer layer having said first conductivity type situated between said collector and said drift region, said inter-trench structure being spaced apart from said buffer layer by said drift region.

12. The IGBT of claim 7, further comprising a buffer layer having said first conductivity type situated between said collector and said drift region, said inter-trench structure adjoining said buffer layer.

13. The bipolar semiconductor device of claim 1, wherein said first conductivity type represents n-type and said second conductivity type represents p-type.

14. The IGBT of claim 7, wherein said first conductivity type represents n-type and said second conductivity type represents p-type.

* * * * *

UNITED STATES PATENT AND TRADEMARK OFFICE
CERTIFICATE OF CORRECTION

PATENT NO. : 9,768,284 B2  
APPLICATION NO. : 14/986150  
DATED : September 19, 2017  
INVENTOR(S) : F. Udrea et al.

Page 1 of 1

It is certified that error appears in the above-identified patent and that said Letters Patent is hereby corrected as shown below:

On the Title Page

Item (57)/Abstract, Line 15, please change "region having" to -- regions having --

Signed and Sealed this  
Nineteenth Day of December, 2017

Joseph Matal  
*Performing the Functions and Duties of the*  
*Under Secretary of Commerce for Intellectual Property and*  
*Director of the United States Patent and Trademark Office*